United States Patent
Naito et al.

(10) Patent No.: US 9,559,315 B2
(45) Date of Patent: Jan. 31, 2017

(54) SURFACE LIGHT-EMITTING ELEMENT AND LIGHT-EMITTING DEVICE

(71) Applicant: KONICA MINOLTA, INC., Chiyoda-ku (JP)

(72) Inventors: Mitsuyoshi Naito, Toyonaka (JP); Junya Wakahara, Settsu (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/892,974

(22) PCT Filed: May 14, 2014

(86) PCT No.: PCT/JP2014/062811
§ 371 (c)(1),
(2) Date: Nov. 20, 2015

(87) PCT Pub. No.: WO2014/192544
PCT Pub. Date: Dec. 4, 2014

(65) Prior Publication Data
US 2016/0181555 A1 Jun. 23, 2016

(30) Foreign Application Priority Data
May 31, 2013 (JP) .................................. 2013-115085

(51) Int. Cl.
*H01L 51/00* (2006.01)
*H01L 51/52* (2006.01)
*G06F 1/16* (2006.01)

(52) U.S. Cl.
CPC ......... *H01L 51/0097* (2013.01); *G06F 1/1637* (2013.01); *H01L 51/5206* (2013.01);
(Continued)

(58) Field of Classification Search
CPC ............ H01L 51/0097; H01L 51/5206; H01L 51/5221; H01L 51/5237; H01L 2251/5338; G06F 1/1637
See application file for complete search history.

(56) References Cited

U.S. PATENT DOCUMENTS

| 8,063,400 B2 | 11/2011 | Sugimoto | |
| 2013/0200409 A1* | 8/2013 | Abe | ........................ H01L 33/62 257/91 |

(Continued)

FOREIGN PATENT DOCUMENTS

| JP | 2002-258774 | 9/2002 |
| JP | 2003-015539 | 1/2003 |

(Continued)

*Primary Examiner* — Ida M Soward
(74) *Attorney, Agent, or Firm* — Cozen O'Connor

(57) ABSTRACT

A light-emitting device (100) includes a housing (20) including a light-transmitting section (25), a surface light-emitting element (10) including a rectangular light-emitting section (R10) facing the light-transmitting section (25) and a non-light-emitting section formed outside the light-emitting section (R10), and an electronic device (31). The non-light-emitting section includes a flexible outer edge section (R13) provided with an electrode on a surface. The outer edge section (R13) is bent in a direction away from a light-emitting surface (S1) of the light-emitting section (R10) together with the electrode. The electrode electrically connects the light-emitting section (R10) and the electronic device (31).

14 Claims, 10 Drawing Sheets

(52) U.S. Cl.
CPC ...... *H01L 51/5221* (2013.01); *H01L 51/5237* (2013.01); *H01L 2251/5338* (2013.01); *Y02E 10/549* (2013.01)

(56) References Cited

U.S. PATENT DOCUMENTS

| | | | |
|---|---|---|---|
| 2014/0028583 A1* | 1/2014 | Cho | G06F 3/041 345/173 |
| 2014/0055702 A1* | 2/2014 | Park | G02F 1/136286 349/43 |
| 2014/0217382 A1* | 8/2014 | Kwon | H01L 51/0097 257/40 |
| 2015/0098025 A1* | 4/2015 | Mouri | H04N 5/64 348/790 |
| 2015/0253487 A1* | 9/2015 | Nichol | G02B 6/0036 362/610 |
| 2016/0218156 A1* | 7/2016 | Shedletsky | G06F 1/1637 |

FOREIGN PATENT DOCUMENTS

| | | |
|---|---|---|
| JP | 2005-071944 | 3/2005 |
| JP | 2006-350181 | 12/2006 |
| JP | 2007-311044 | 11/2007 |
| JP | 2010-181808 | 8/2010 |
| JP | 4717946 | 4/2011 |
| JP | 2013-065523 | 4/2013 |

\* cited by examiner

SURFACE LIGHT-EMITTING ELEMENT AND LIGHT-EMITTING DEVICE

RELATED APPLICATIONS

This is a U.S. National stage of International application No. PCT/JP2014/062811 filed on May 14, 2014.

This patent application claims the priority of Japanese application No. 2013-115085 filed May 31, 2013 the disclosure content of which is hereby incorporated by reference.

TECHNICAL FIELD

The present invention relates to a surface light-emitting element and a light-emitting device, and particularly relates to a surface light-emitting element having flexibility and a light-emitting device including such a surface light-emitting element.

BACKGROUND ART

As disclosed in JP 2007-311044 A (Patent Literature 1) and JP 4717946 B (Patent Literature 2), light-emitting devices including a surface light-emitting element such as an organic EL as a light-emitting source are known. In the typical surface light-emitting element, a non-light-emitting section is formed in a periphery of the light-emitting section in order to secure a portion (wiring portion) where an electrode for supplying electricity to the light-emitting section is provided, and to cover the light-emitting section with a sealing member.

CITATION LIST

Patent Literatures

Patent Literature 1: JP 2007-311044 A
Patent Literature 2: JP 4717946 B

SUMMARY OF INVENTION

Technical Problem

It is sometimes difficult to arrange the surface light-emitting element in a narrow space due to existence of the non-light emitting section in a structure or an arrangement structure of the conventional surface light-emitting element.

An object of the present invention is to provide a surface light-emitting element that can be easily arranged in a narrower space, and a light-emitting device including such a surface light-emitting element.

Solution to Problem

A light-emitting device according to an aspect of the present invention includes: a housing including a light-transmitting section; a surface light-emitting element arranged in the housing, and including a rectangular light-emitting section facing the light-transmitting section, and a non-light-emitting section formed outside the light-emitting section; and an electronic device arranged in the housing, the non-light-emitting section includes a flexible outer edge section provided with an electrode on a surface, the outer edge section is bent in a direction away from a light-emitting surface of the light-emitting section together with the electrode, and the electrode electrically connects the light-emitting section and the electronic device.

A surface light-emitting element according to another aspect of the present invention includes: a rectangular light-emitting section; and a non-light-emitting section formed outside the light-emitting section, the non-light-emitting section includes a flexible outer edge section, and an electrode that electrically connects the light-emitting section and an electronic device is provided on a surface of the outer edge section in a state of being bent in a direction away from a light-emitting surface of the light-emitting section together with the outer edge section.

DESCRIPTION OF EMBODIMENTS

Embodiments based on the present invention will be described with reference to the drawings. When the number or an amount is referred in the description of the embodiments, a range of the present invention is not necessarily limited to the number or the amount unless otherwise specifically stated. In the description of the embodiments, the same parts or equivalent parts are denoted with the same reference sign, and overlapping description may not be repeated.

[First Embodiment]

(Light-Emitting Device 100)

Figure 1:
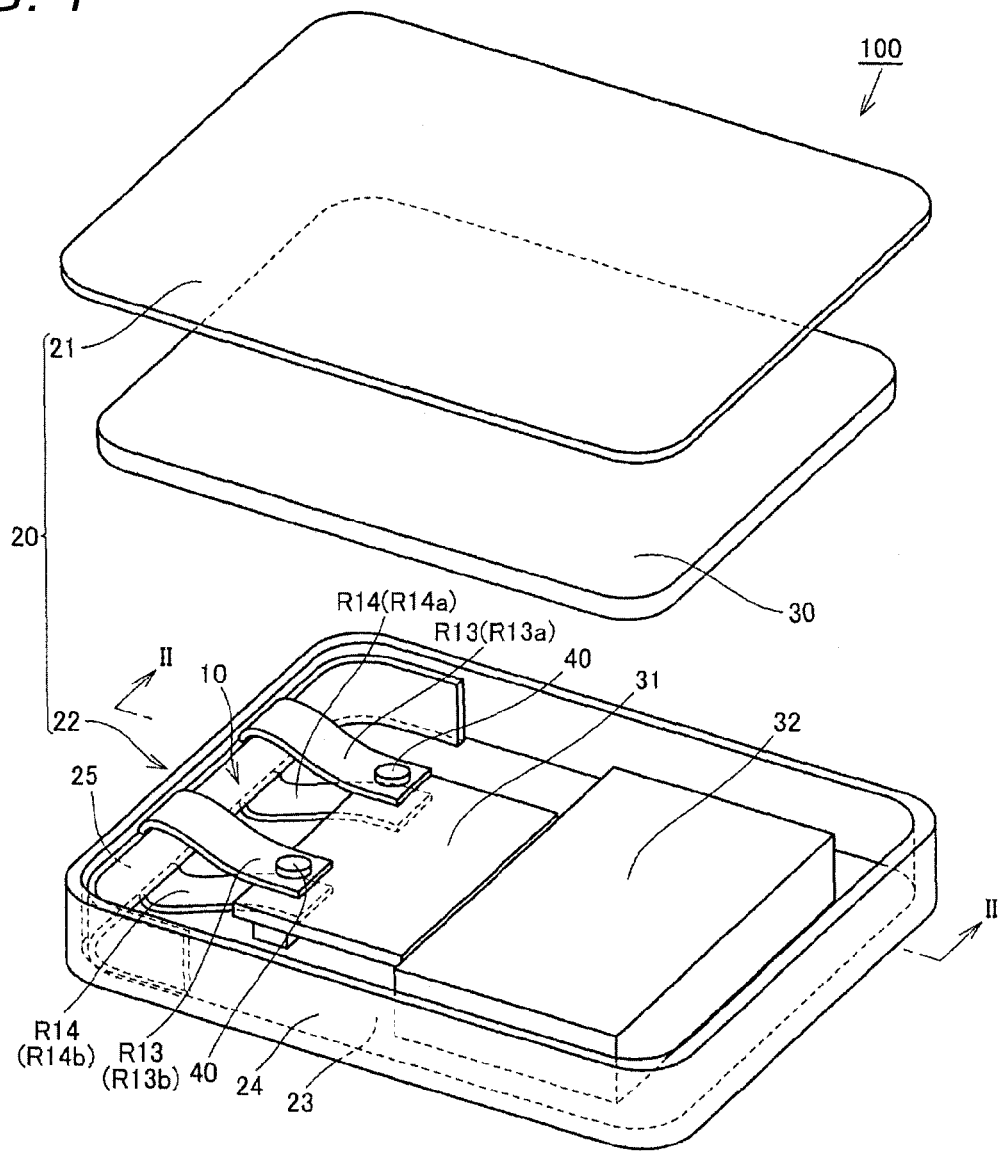
FIG. 1 is a perspective view illustrating a disassembled state of a light-emitting device in a first embodiment.
Figure 2:
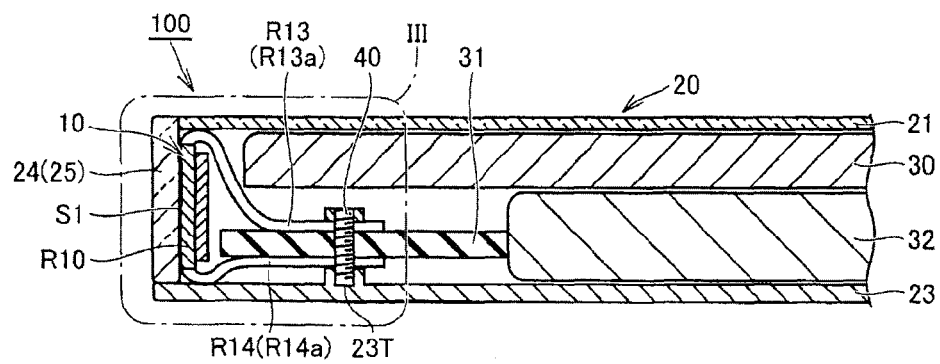
FIG. 2 is an arrow sectional view along the II-II line in FIG. 1.
Figure 3:
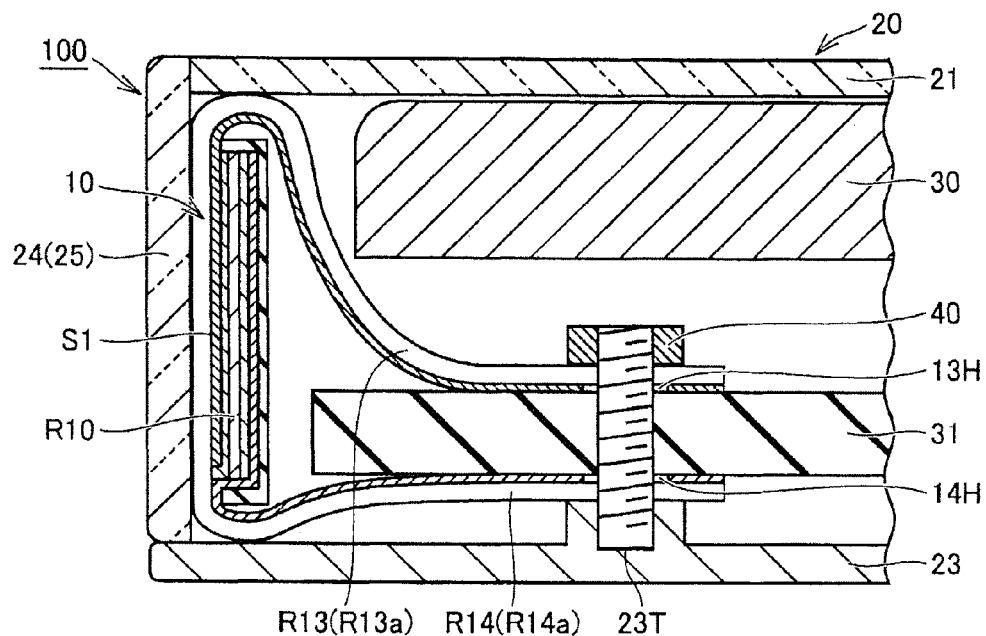
FIG. 3 is a sectional view illustrating an enlarged region surrounded by the III line in FIG. 2.

FIG. 1 is a perspective view illustrating a disassembled state of a light-emitting device 100 in the present embodiment. FIG. 2 is an arrow sectional view along the II-II line in FIG. 1. FIG. 3 is a sectional view illustrating an enlarged region surrounded by the III line in FIG. 2. As illustrated in FIG. 1, the light-emitting device 100 includes a surface light-emitting element 10, a housing 20, a display unit 30, an electronic substrate 31 (electronic device), a built-in device 32, and fixing tools 40. The housing 20 includes a cover 21 and an accommodation section 22.

The cover 21 is a member made of glass, an acrylic resin, or the like having transparency. The accommodation section 22 includes a bottom panel 23 and a peripheral wall 24. The bottom panel 23 is a member made of metal, for example. Screw holes 23T are provided in the bottom panel 23. The peripheral wall 24 is provided along a peripheral edge of the bottom panel 23 in a loop manner, and rises from the peripheral edge. A light-transmitting section 25 (see FIGS. 1 to 3) is provided in a part of the peripheral wall 24. The light-transmitting section 25 is formed of a transparent member such as glass or an acrylic resin. The entire peripheral wall 24 may be formed of a transparent member such as glass or an acrylic resin.

The cover 21 is fixed to the peripheral wall 24 to block an upper-side opening of the peripheral wall 24. A hollow accommodation space is formed in the housing 20. The surface light-emitting element 10, the electronic substrate 31, the built-in device 32, and the fixing tools 40 are arranged inside the housing 20 (in the above-described accommodation space). The electronic substrate 31 includes various wiring patterns, drive circuits, and the like. The built-in device 32 includes a battery and the like.

(Surface Light-Emitting Element 10)

Figure 4:
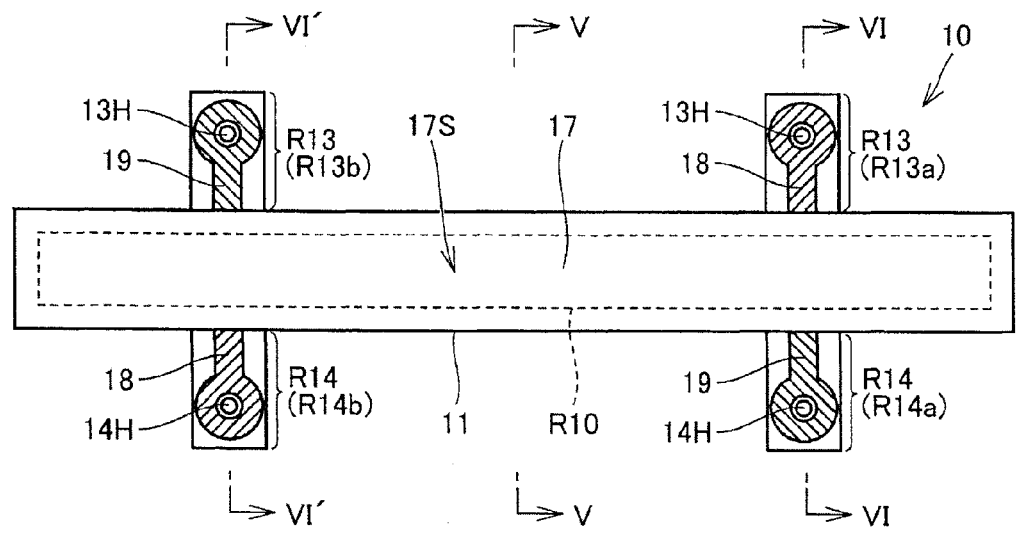
FIG. 4 is a plan view illustrating a surface light-emitting element included in the light-emitting device in the first embodiment.
Figure 5:
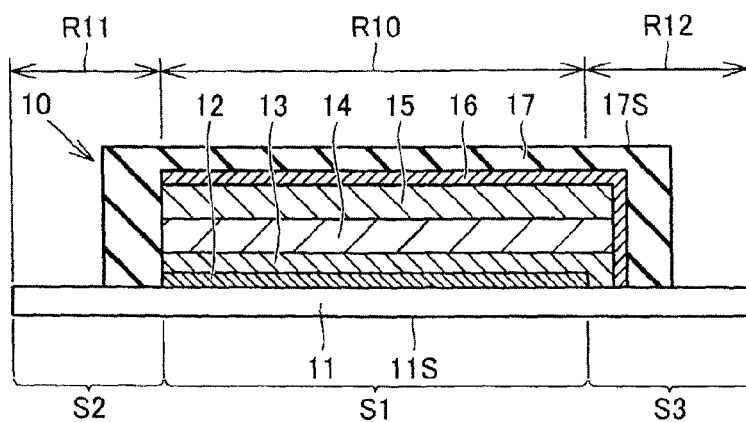
FIG. 5 is an arrow sectional view along the V-V line in FIG. 4.
Figure 6:
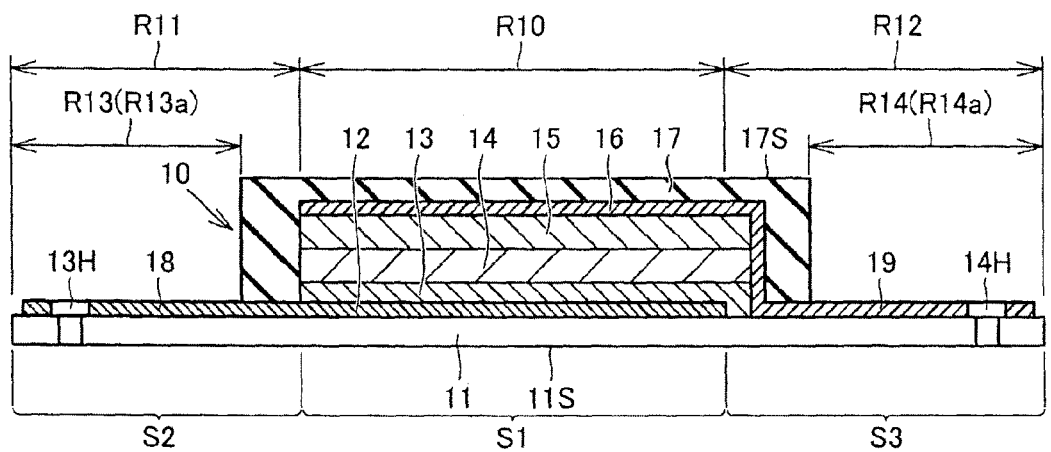
FIG. 6 is an arrow sectional view along the VI-VI line in FIG. 4.

FIG. 4 is a plan view illustrating the surface light-emitting element 10. FIG. 5 is an arrow sectional view along the V-V line in FIG. 4. FIG. 6 is an arrow sectional view along the VI-VI line in FIG. 4. The surface light-emitting element 10 of the present embodiment is manufactured using an organic EL element. The surface light-emitting element 10 includes a transparent substrate 11, an anode 12, a hole transport layer 13, an organic layer 14, an electron transport layer 15, a cathode 16, and a sealing member 17.

The anode 12, the hole transport layer 13, the organic layer 14, the electron transport layer 15, and the cathode 16 are sequentially stacked on a back surface of the transparent substrate 11. A surface of the transparent substrate 11 forms a surface 11S as the surface light-emitting element 10. A light-emitting surface S1 and non-light-emitting surfaces S2 and S3 are formed on the surface 11S (details will be described below). A surface of the sealing member 17 forms a back surface 17S as the surface light-emitting element 10.

The transparent substrate 11 is manufactured from a film substrate such as a polyethylene terephthalate (PET) or polycarbonate. The anode 12 is a conductive film having transparency. The anode 12 is formed of an indium tin oxide (ITO) or the like. The hole transport layer 13 is a layer for supplying a hole from the anode 12 to the organic layer 14.

The electron transport layer 15 is a layer for supplying an electron from the cathode 16 to the organic layer 14.

The organic layer 14 generates light by being supplied power. The cathode 16 is manufactured from aluminum (AL) or the like. The cathode 16 is formed to cover the anode 12, hole transport layer 13, the organic layer 14, and the electron transport layer 15. The sealing member 17 is manufactured from a resin or the like that has insulation properties. The sealing member 17 protects the organic layer 14 and the like. The sealing member 17 seals approximately entire anode 12, hole transport layer 13, organic layer 14, electron transport layer 15, and cathode 16 on the transparent substrate 11.

A part of the anode 12 (ITO film) is exposed from the sealing member 17 for electrical connection (see FIGS. 4 and 6). The portion of the anode 12, which is exposed from the sealing member 17, configures an anode electrode taking-out section 18 (see FIG. 6). A part of the cathode 16 (AL film) is also exposed from the sealing member 17 for electrical connection (see FIGS. 4 and 6). The portion of the cathode 16, which is exposed from the sealing member 17, configures a cathode electrode taking-out section 19 (see FIG. 6). Note that the part of the anode 12 (ITO film) and the part of the cathode 16 (AL film) are configured to be exposed from the sealing member 17 in a state where the right and left of FIG. 6 are inverted, in the arrow sectional view in the position along the VI'-VI' line in FIG. 4.

In the surface light-emitting element 10 configured as described above, a light-emitting section R10 and non-light-emitting sections R11 and R12 are configured. The light-emitting section R10 is a section that functions as light-emitting means. An outer edge shape of the light-emitting section R10 corresponds to an outer edge portion of a portion sandwiched by the anode 12 and the cathode 16, of a portion where the organic layer 14 is formed. The outer edge shape (the portion illustrated by the dotted line in FIG. 4) of the light-emitting section R10 of the present embodiment has a rectangular shape. The non-light-emitting sections R11 and R12 are sections respectively positioned both outsides of the light-emitting section R10.

A surface of the light-emitting section R10 of the transparent substrate 11 side forms the light-emitting surface S1. The light generated in the organic layer 14 is emitted to an outside mainly through the light-emitting surface S1. The light-emitting surface S1 also has an approximately rectangular shape. A surface of the non-light-emitting section R11 of the transparent substrate 11 side forms the non-light-emitting surface S2, and a surface of the non-light-emitting section R12 of the transparent substrate 11 side forms the non-light-emitting surface S3. The non-light-emitting surfaces S2 and S3 are portions that hardly emit light even if the light is generated in the organic layer 14.

In the present embodiment, flexible outer edge sections R13 and R14 are provided in a part of the transparent substrate 11. The outer edge sections R13 and R14 have a shape outwardly extending from the portion where the light-emitting section R10 in a piece shaped manner. Referring to FIGS. 4 and 6, the outer edge sections R13 (R13a) and R13 (R13b) are sections included in the non-light-emitting section R11, and the outer edge sections R14 (R14a) and R14 (R14b) are sections included in the non-light-emitting section R12.

The anode electrode taking-out sections 18 (anode electrodes) exposed from the sealing member 17 are respectively provided on a surface of the outer edge section R13 (R13a) and a surface of the outer edge section R14 (R14b). The cathode electrode taking-out sections 19 (cathode electrodes) exposed from the sealing member 17 are respectively provided on a surface of the outer edge section R13 (R13b) and a surface of the outer edge section R14 (R14a). As is clear from FIG. 4, in the present embodiment, the anode electrode taking-out section 18 and the cathode electrode taking-out section 19 are provided to be exposed from the same side of the sealing member 17, for example, from an upper side of FIG. 4. Meanwhile, the cathode electrode taking-out section 19 and the anode electrode taking-out section 18 are provided to be exposed from the other side of the sealing member 17, for example, from a lower side of the FIG. 4. However, such a configuration is not essential, and for example, a configuration in which the anode electrode taking-out sections 18 and 18 are exposed from the upper side of FIG. 4, and the cathode electrode taking-out sections 19 and 19 are exposed from the lower side of FIG. 4 may be employed. The same applies to the modifications described below.

Through holes 13H (fixing sections) for fixing the outer edge sections R13 (R13a) and R13 (R13b) to the electronic substrate 31 (see FIGS. 1 to 3) are provided in the outer edge sections R13 (R13a) and R13 (R13b). The through holes 13H are provided to penetrate insides of the outer edge sections, where the electrode taking-out sections 18 and 19 are provided (see FIG. 6). Through holes 14H (fixing sections) for fixing the outer edge sections R14 (R14a) and R14 (R14b) to the electronic substrate 31 (see FIGS. 1 to 3) are provided in the outer edge sections R14 (R14a) and R14 (R14b). The through holes 14H are also provided to penetrate inner sides of the outer edge sections, where the electrode taking-out sections 18 and 19 are provided (see FIG. 6).

Referring back to FIGS. 1 to 3, the surface light-emitting element 10 configured as described above is arranged to extend along the shape of an inner peripheral surface of the peripheral wall 24 (light-transmitting section 25), and the light-emitting surface S1 of the light-emitting section R10 is arranged to face the light-transmitting section 25. The outer edge sections R13 (R13a) and R13 (R13b) are bent in a direction away from the light-emitting surface S1 together with the electrode taking-out sections 18 and 19 (see FIG. 4) formed in the surfaces of the outer edge sections, and are arranged on the upper surface side of the electronic substrate 31. The outer edge sections R14 (R14a) and R14 (R14b) are bent in a direction away from the light-emitting surface S1 together with the electrode taking-out sections 18 and 19 (see FIG. 4) formed in the surfaces of the outer edge sections, and are arranged on the lower surface of the electronic substrate 31.

The outer edge sections R13 (R13a) and R14 (R14a) are arranged to sandwich the electronic substrate 31 from upper and lower surfaces. The fixing tools 40 are screwed into the screw holes 23T through the through holes 13H and 14H (see FIG. 4), and fix the outer edge sections R13 (R13a) and R14 (R14a) to the electronic substrate 31. Similarly, the outer edge sections R13 (R13b) and R14 (R14b) are arranged to sandwich the electronic substrate 31 from upper and lower surface. The fixing tools 40 are screwed into the screw holes 23T through the through holes 13H and 14H (see FIG. 4), and fix the outer edge sections R13 (R13b) and R14 (R14b) to the electronic substrate 31.

The electrode taking-out sections 18 and 19 formed in the respective outer edge sections are electrically connected to a wiring pattern formed on the electronic substrate 31 in a state where the outer edge sections are fixed to the electronic substrate 31 with the fixing tools 40. For electrical connection, the electrode taking-out sections 18 and 19 are directly pressed against the wiring pattern formed on the electronic substrate 31 using the fixing tools 40, or may be connected separately using wiring members or solder. By the connection, the organic layer 14 of the light-emitting section R10 is electrically connected to the wiring pattern formed on the electronic substrate 31. The light-emitting device 100 and the surface light-emitting element 10 of the present embodiment are configured as described above.

In the light-emitting device 100 of the present embodiment, the surface light-emitting element 10 is arranged in a narrow space between the cover 21 and the bottom panel 23. The outer edge sections R13 and R14 (a part of the non-light-emitting sections) provided to secure the portions that supply electricity to the organic layer 14 are bent along the cover 21 and the bottom panel 23. In the light-emitting device 100, the area of the light-emitting surface S1 of the light-emitting section R10 facing the light-transmitting section 25 can be secured as large as possible, and further, the light-emitting element 10 can be easily wired to the wiring pattern on the electronic substrate 31, by making use of the flexibility of the outer edge sections R13 and R14.

[Second Embodiment]

Figure 7:
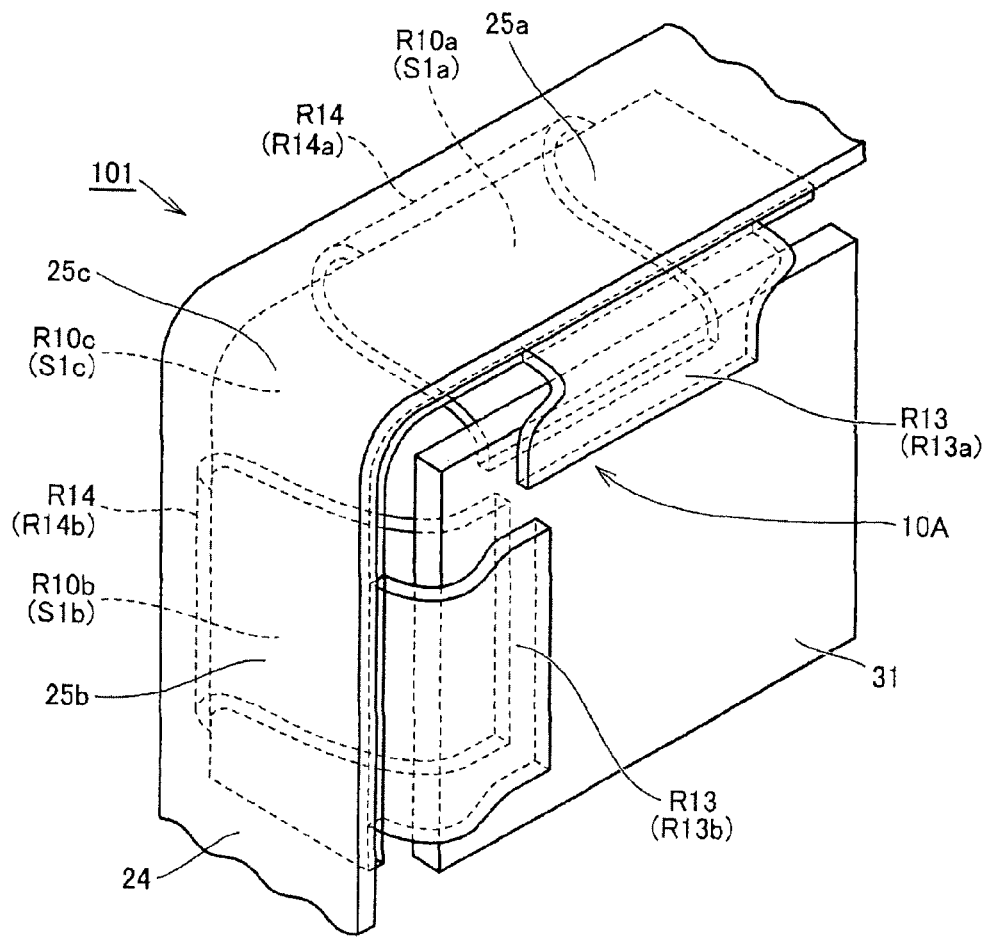
FIG. 7 is a perspective view illustrating a part of a light-emitting device in the second embodiment.
Figure 8:
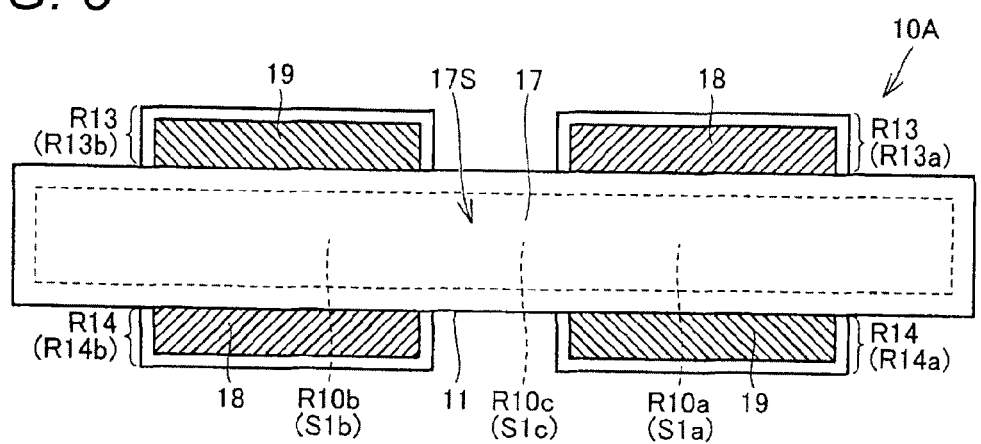
FIG. 8 is a plan view illustrating a surface light-emitting element included in the light-emitting device in the second embodiment.

FIG. 7 is a perspective view illustrating a part of a light-emitting device 101 in the present embodiment. FIG. 8 is a plan view illustrating a surface light-emitting element 10A included in the light-emitting device 101. Referring to FIG. 7, a peripheral wall 24 of a housing used for the light-emitting device 101 includes light-transmitting sections 25a, 25b, and 25c. The light-transmitting sections 25a, 25b, and 25c have transparency. The light-transmitting section 25a and the light-transmitting section 25b have flat-plate shape, and the light-transmitting section 25c is provided between the light-transmitting section 25a and the light-transmitting section 25b and is bent.

Referring to FIG. 8, the surface light-emitting element 10A of the present embodiment includes light-emitting sections R10a, R10b, and R10c, and at least the light-emitting section R10c is configured to have flexibility. All of the light-emitting sections R10a, R10b, and R10c may have flexibility. The surface light-emitting element 10A is arranged in a state where the light-emitting section R10c is bent, as illustrated in FIG. 7. The light-emitting sections R10a, R10b, and R10c are formed to be continued to each other, and have a rectangular external shape, as illustrated in FIG. 8, in a state where the surface light-emitting element 10A is not bent.

The surface light-emitting element 10A is bent along shapes of inner peripheral surfaces of light-transmitting sections 25a, 25b, and 25c. To be specific, the light-emitting sections R10a and R10b are arranged in a flat plate manner along the shapes of the inner peripheral surfaces of the light-transmitting sections 25a and 25b. A light-emitting surface S1a of the light-emitting section R10a directly faces the light-transmitting section 25a, and a light-emitting surface S1b of the light-emitting section R10b directly faces the light-transmitting section 25b. The light-emitting section R10c is bent along the shape of the inner peripheral surface of the light-transmitting section 25c. A light-emitting surface S1c of the light-emitting section R10c directly faces the light-transmitting section 25c in a bent state.

An outer edge section R13 (R13a) is bent in a direction away from the light-emitting surface S1a together with an electrode taking-out section (not illustrated) formed in the surface of the outer edge section, and is arranged on one surface side of an electronic substrate 31. An outer edge section R13 (R13b) is bent in a direction away from the light-emitting surface S1b together with an electrode taking-out section (not illustrated) formed in the surface of the outer edge section, and is arranged on the one surface side of the electronic substrate 31.

An outer edge section R13 (R14a) is bent in a direction away from the light-emitting surface S1b together with an electrode taking-out section (not illustrated) formed in the surface of the outer edge section, and is arranged on the other surface side of the electronic substrate 31. An outer edge section R13 (R14b) is bent in a direction away from the light-emitting surface S1b together with an electrode taking-out section (not illustrated) formed in the surface of the outer edge section, and is arranged on the other surface side of the electronic substrate 31.

The outer edge sections R13 and R14 are arranged to sandwich the electronic substrate 31 from upper and lower surfaces, and are fixed on the electronic substrate 31 with fixing tools (not illustrated). The electrode taking-out sections formed in the respective outer edge sections are electrically connected to a wiring pattern formed on the electronic substrate 31. By the connection, an organic layer of the light-emitting sections is electrically connected to the wiring pattern formed on the electronic substrate 31.

In the light-emitting device 101 of the present embodiment, the surface light-emitting element 10A can be arranged in a narrow space. The outer edge sections R13 and R14 (a part of non-light-emitting sections) provided to secure portions that supply electricity to the organic layer are bent. In the light-emitting device 101, the areas of the light-emitting surfaces of the light-emitting sections facing the light-transmitting sections can be secured as large as possible, and emission of light from the light-transmitting section 25c formed in a bent manner can be realized. The surface light-emitting element 10A can be easily wired to the wiring pattern on the electronic substrate 31, by making use of the flexibility of the outer edge sections R13 and R14.

[Modification]

Hereinafter, modifications of surface light-emitting elements that can be applied to the first and second embodiments will be described.

(First Modification)

Figure 9:
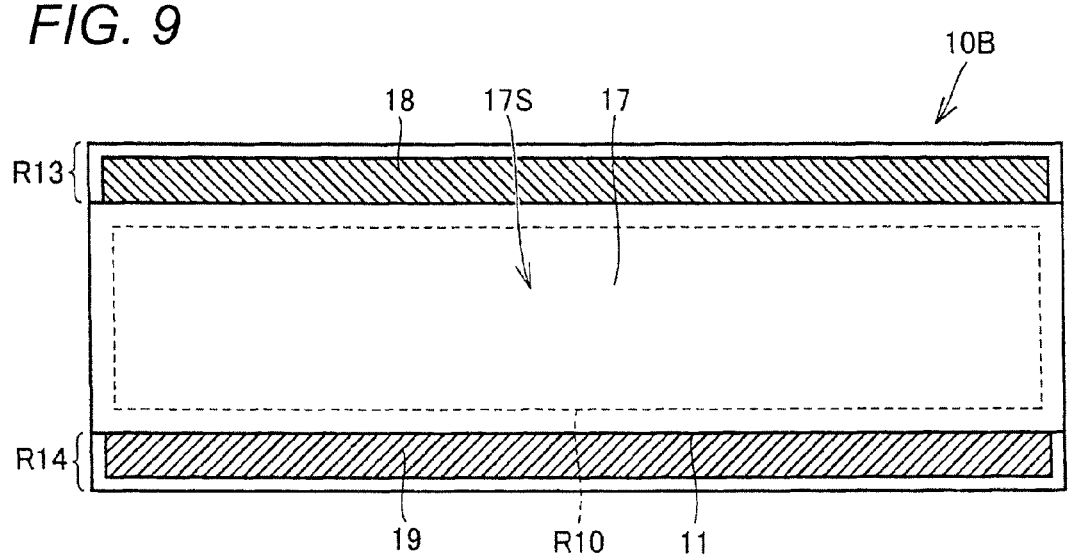
FIG. 9 is a plan view illustrating a surface light-emitting element in a first modification of an embodiment.

Referring to FIG. 9, the above-described each surface light-emitting element includes four outer edge sections. A surface light-emitting element 10B of the present modification includes an outer edge section R13 (first outer edge section) and an outer edge section R14 (second outer edge section). The outer edge sections R13 and R14 are positioned at mutually opposite sides across a light-emitting section R10. The outer edge sections R13 and R14 have a shape extending from one end portion to the other end portion in a rectangular shape manner in plan view along a longitudinal direction of a sealing member 17. An anode electrode taking-out section 18 is formed into a rectangular shape throughout an approximately front surface of the outer edge section R13, and a cathode electrode taking-out section 19 is formed into a rectangular shape throughout an approximately front surface of the outer edge section R14. Similar functions and effects to the above description can be obtained even when such a surface light-emitting element 10B is applied to the first and second embodiments.

(Second Modification)

Figure 10:
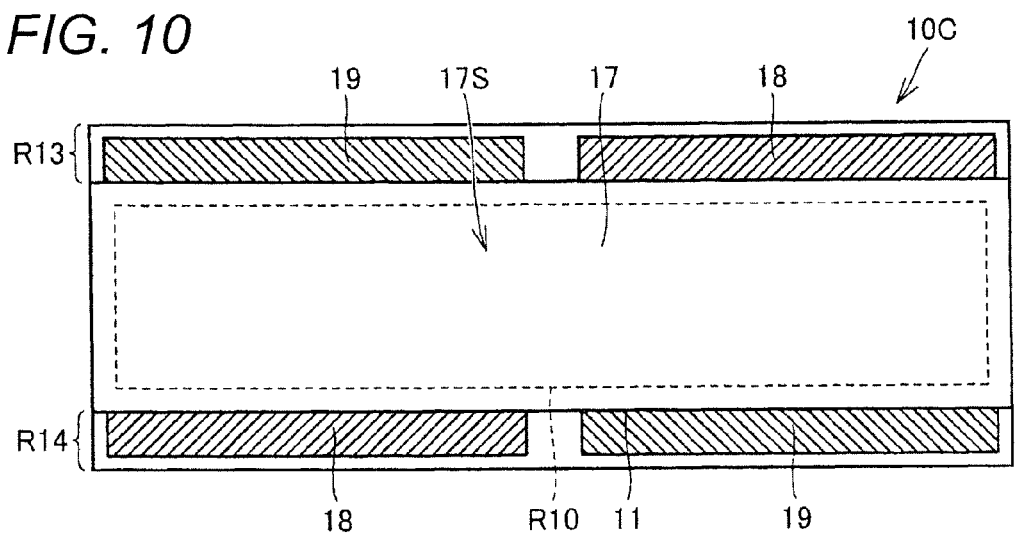
FIG. 10 is a plan view illustrating a surface light-emitting element in a second modification of an embodiment.

Referring to FIG. 10, in a surface light-emitting element 10C of the present modification, an anode electrode taking-out section 18 and a cathode electrode taking-out section 19 are formed in an outer edge section R13 (first outer edge section), and an anode electrode taking-out section 18 and a cathode electrode taking-out section 19 are formed in an outer edge section R14. In the present modification, two electrode taking-out sections are formed in one outer edge section. Similar functions and effects to the above description can be obtained even when such a surface light-emitting element 10C is applied to the first and second embodiments. The electrode taking-out sections having the same polarity may be formed in one outer edge section.

(Third Modification)

Figure 11:
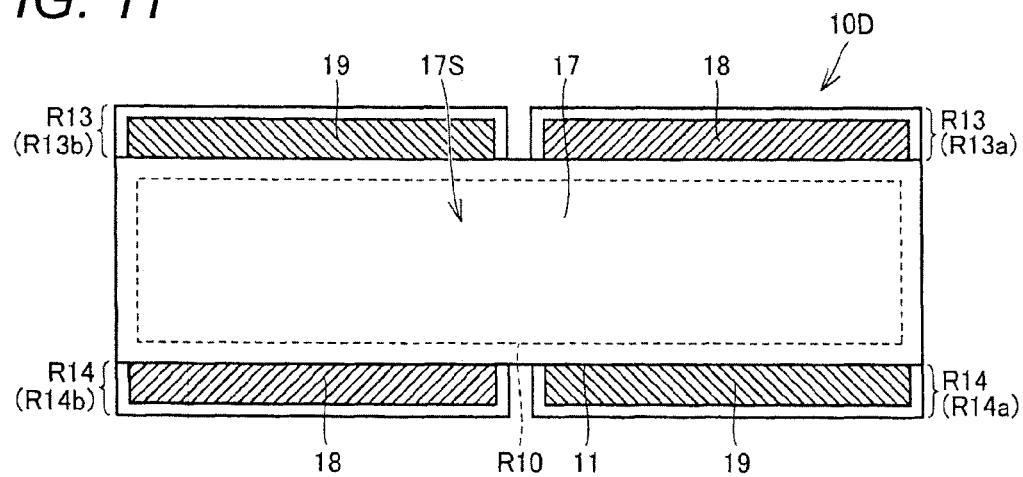
FIG. 11 is a plan view illustrating a surface light-emitting element in a third modification of an embodiment.

Referring to FIG. 11, a surface light-emitting element 10D of the present modification includes four outer edge sections. Outer edge sections R13 (R13a) and R13 (R13b) are formed side by side along one outer edge of a light-emitting section R10, and outer edge sections R14 (R14a) and R14 (R14b) are formed side by side along the other one outer edge of the light-emitting section R10. The outer edge sections R13 (R13a) and R13 (R13b) are positioned at an opposite side to the outer edge sections R14 (R14a) and R14 (R14b) across the light-emitting section R10. Anode electrode taking-out sections 18 are formed on the outer edge sections R13 (R13a) and R14 (R14b), and cathode electrode taking-out sections 19 are formed on the outer edge sections R13 (R13b) and R14 (R14a). Similar functions and effects to the above description can be obtained even when such a surface light-emitting element 10D is applied to the first and second embodiments.

(Fourth Modification)

Figure 12:
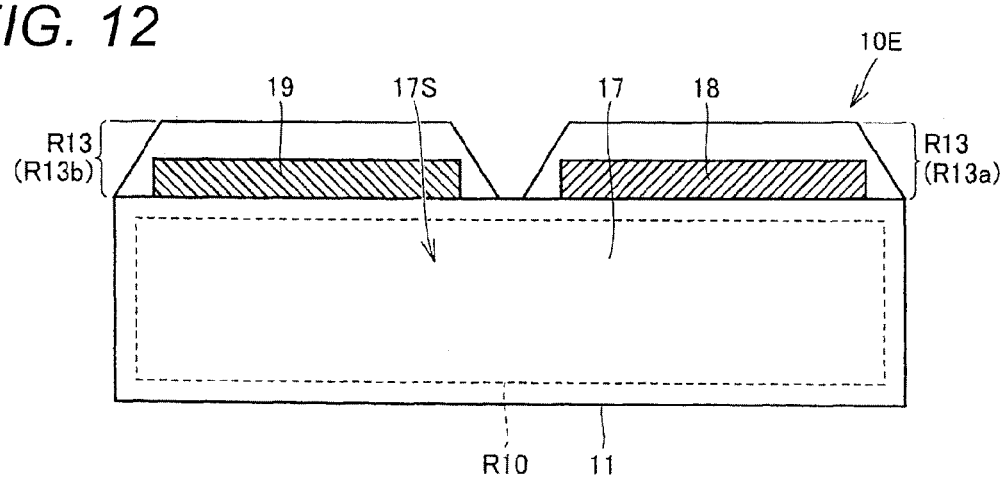
FIG. 12 is a plan view illustrating a surface light-emitting element in a fourth modification of an embodiment.

Referring to FIG. 12, a surface light-emitting element 10E of the present modification includes two outer edge sections. Outer edge sections R13 (R13a) and R13 (R13b) are formed side by side along one outer edge of a light-emitting section R10. An anode electrode taking-out section 18 is formed on the outer edge section R13 (R13a), and a cathode electrode taking-out section 19 is formed on the outer edge section R13 (R13b). The outer edge sections R13 (R13a) and R13 (R13b) have a trapezoidal shape in plan view. Similar functions and effects to the above description can be obtained even when such a surface light-emitting element 10E is applied to the first and second embodiments.

(Fifth Modification)

Figure 13:
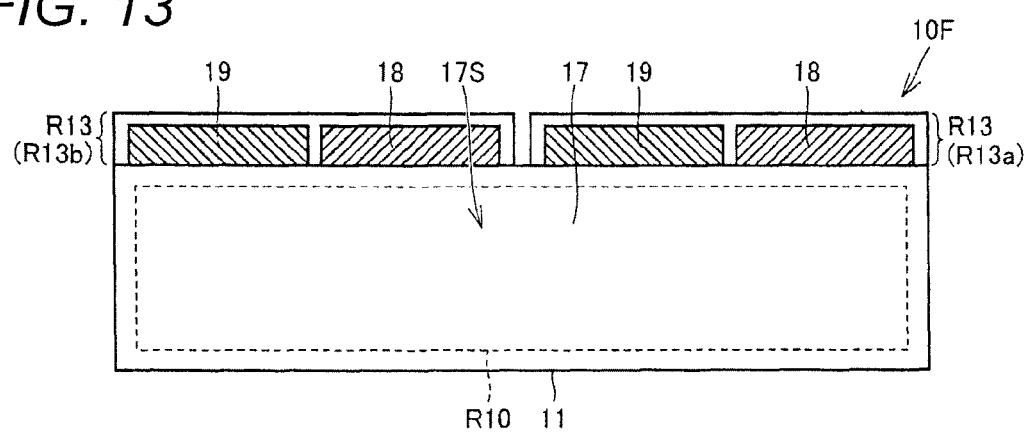
FIG. 13 is a plan view illustrating a surface light-emitting element in a fifth modification of an embodiment.

Referring to FIG. 13, a surface light-emitting element 10F of the present modification includes two outer edge sections. Outer edge sections R13 (R13a) and R13 (R13b) are formed side by side along one outer edge of a light-emitting section R10. An anode electrode taking-out section 18 and a cathode electrode taking-out section 19 are formed on the outer edge section R13 (R13a). Another anode electrode taking-out section 18 and another cathode electrode taking-out section 19 are formed on the outer edge section R13 (R13b). Similar functions and effects to the above description can be obtained even when such a surface light-emitting element 10F is applied to the first and second embodiments.

(Sixth Modification)

Figure 14:
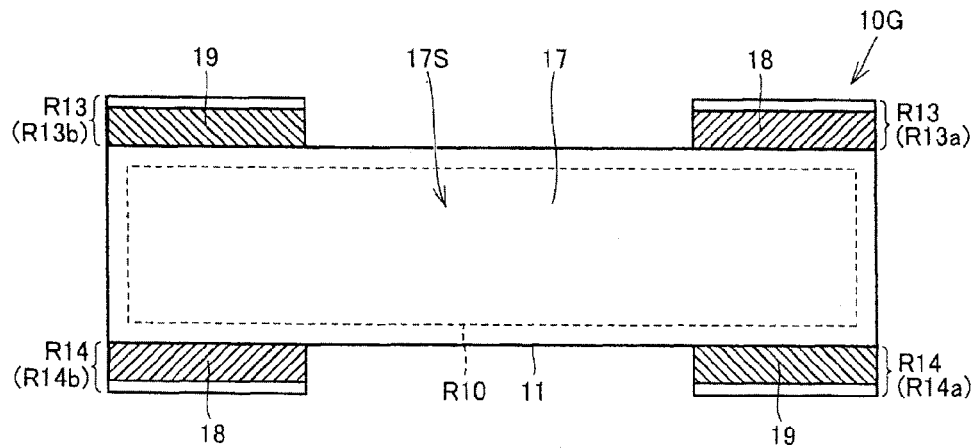
FIG. 14 is a plan view illustrating a surface light-emitting element in a sixth modification of an embodiment.

Referring to FIG. 14, a surface light-emitting element 10G of the present modification includes four outer edge sections. Outer edge sections R13 (R13a) and R13 (R13b) are formed side by side along one outer edge of a light-emitting section R10, and outer edge sections R14 (R14a) and R14 (R14b) are formed along another one edge of the light-emitting section R10. The outer edge sections R13 (R13a) and R13 (R13b) are positioned at an opposite side to the outer edge sections R14 (R14a) and R14 (R14b) across the light-emitting section R10. Anode electrode taking-out sections 18 are formed on the outer edge sections R13 (R13a) and R14 (R14b) and cathode electrode taking-out sections 19 are formed on the outer edge sections R13 (R13b) and R14 (R14a).

A space between the outer edge sections R13 (R13a) and R13 (R13b) is broader than that in the above-described third modification (see FIG. 11). A space between the outer edge sections R13 (R13a) and R14 (R14b) is broader than that in the third modification (see FIG. 11). Similar functions and effects to the above description can be obtained even when such a surface light-emitting element 10G is applied to the first and second embodiments.

(Seventh Modification)

Figure 15:
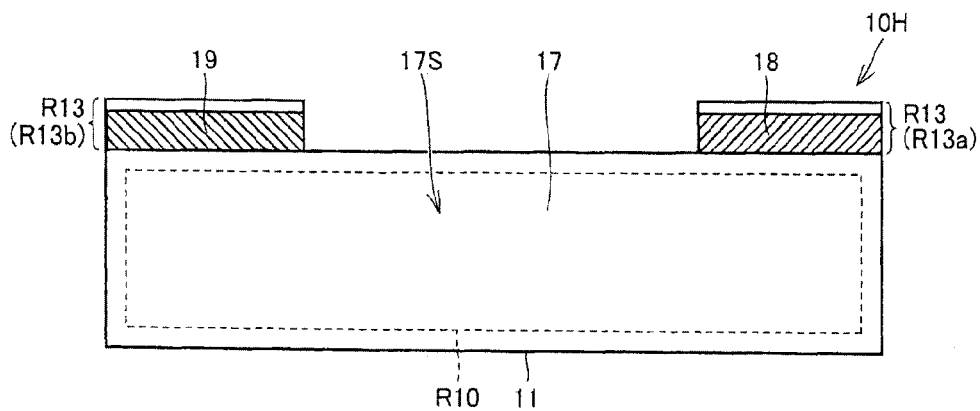
FIG. 15 is a plan view illustrating a surface light-emitting element in a seventh modification of an embodiment.

Referring to FIG. 15, a surface light-emitting element 10H of the present modification includes two outer edge sections. Outer edge sections R13 (R13a) and R13 (R13b) are formed side by side along one outer edge of a light-emitting section R10. An anode electrode taking-out section 18 is formed on the outer edge section R13 (R13a), and a cathode electrode taking-out section 19 is formed on the outer edge section R13 (R13b). A space between the outer edge sections R13 (R13a) and R13 (R13b) is broader than that in the above-described fourth modification (see FIG. 12). Similar functions and effects to the above description can be obtained even when such a surface light-emitting element 10H is applied to the first and second embodiments.

(Eighth Modification)

Figure 16:
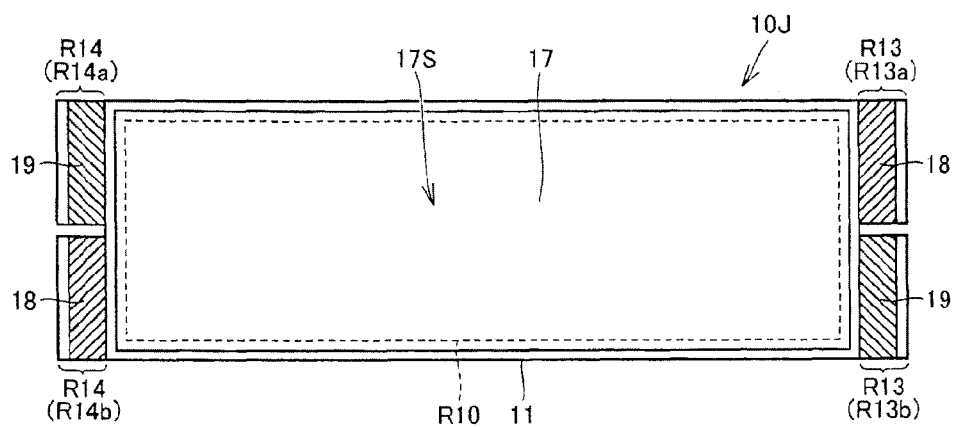
FIG. 16 is a plan view illustrating a surface light-emitting element in an eighth modification of an embodiment.

Referring to FIG. 16, a surface light-emitting element 10J of the present modification includes four outer edge sections. Outer edge sections R13 (R13a) and R13 (R13b) are formed side by side along one outer edge (short side) of a light-emitting section R10, and outer edge sections R14 (R14a) and R14 (R14b) are formed side by side along the other one outer edge (short side) of the light-emitting section R10. The outer edge sections R13 (R13a) and R13 (R13b) are positioned at an opposite side to the outer edge sections R14 (R14a) and R14 (R14b) across the light-emitting section R10. Anode electrode taking-out sections 18 are formed on the outer edge sections R13 (R13a) and R14 (R14b), and cathode electrode taking-out sections 19 are formed on the outer edge sections R13 (R13b) and R14 (R14a). Similar functions and effects to the above description can be obtained even when such a surface light-emitting element 10J is applied to the first and second embodiments.

(Ninth Modification)

Figure 17:
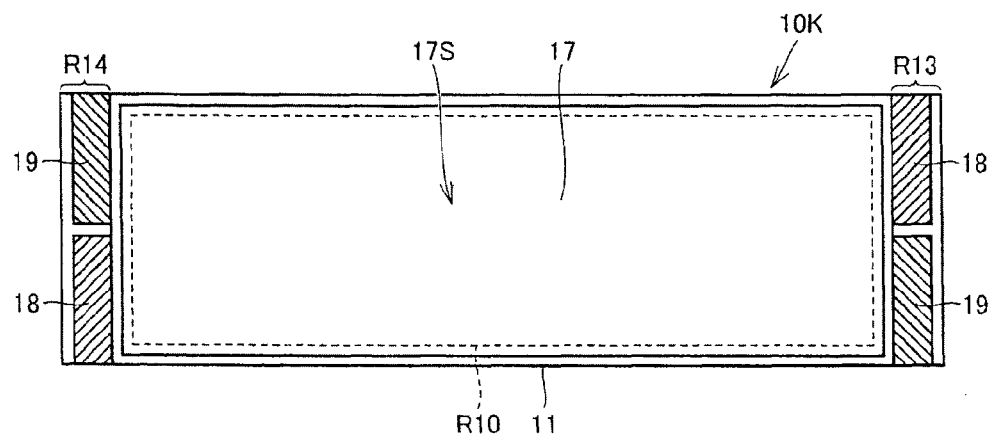
FIG. 17 is a plan view illustrating a surface light-emitting element in a ninth modification of an embodiment.

Referring to FIG. 17, a surface light-emitting element 10K of the present modification includes two outer edge sections. An outer edge section R13 is formed along one outer edge (short side) of a light-emitting section R10, and an outer edge section R14 is formed side by side along the other one outer edge (short side) of the light-emitting section R10. The outer edge section R13 is positioned at an opposite side to the outer edge section R14 across the light-emitting section R10. An anode electrode taking-out section 18 and a cathode electrode taking-out section 19 are formed on the outer edge section R13, and another anode electrode taking-out section 18 and another cathode electrode taking-out section 19 are formed on the outer edge section R14. Similar functions and effects to the above description can be obtained even when such a surface light-emitting element 10K is applied to the first and second embodiments.

(Tenth Modification)

Figure 18:
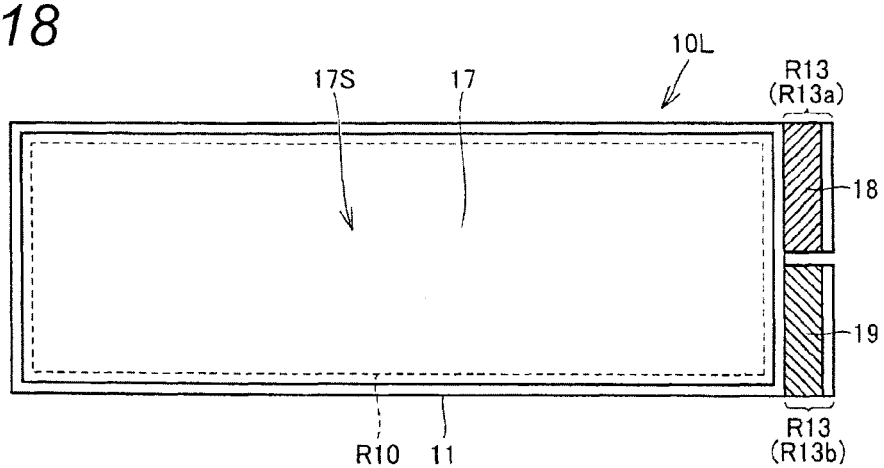
FIG. 18 is a plan view illustrating a surface light-emitting element in a tenth modification of an embodiment.

Referring to FIG. 18, a surface light-emitting element 10L of the present modification includes two outer edge sections. Outer edge sections R13 (R13a) and R13 (R13b) are formed side by side along one outer edge (short side) of a light-emitting section R10. An anode electrode taking-out section 18 is formed on the outer edge section R13 (R13a), and a cathode electrode taking-out section 19 is formed on the outer edge section R13 (R13b). Similar functions and effects to the above description can be obtained even when such a surface light-emitting element 10L is applied to the first and second embodiments.

(Eleventh Modification)

Figure 19:
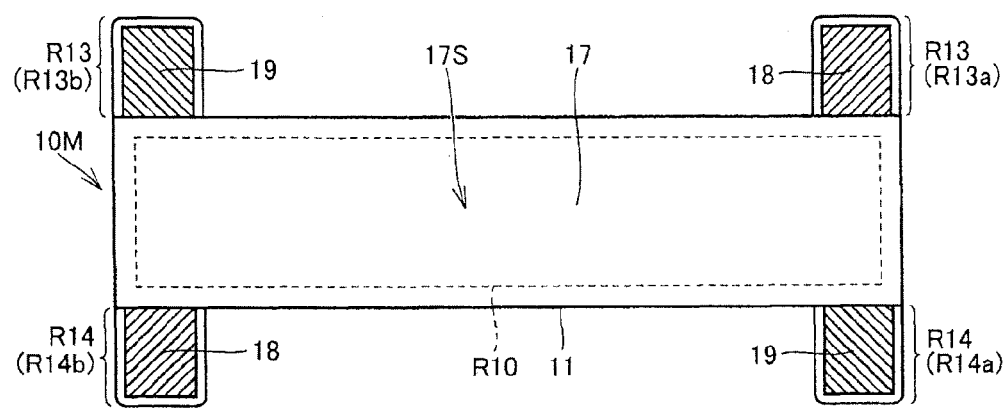
FIG. 19 is a plan view illustrating a surface light-emitting element in an eleventh modification of an embodiment.

Referring to FIG. 19, a surface light-emitting element 10M of the present modification includes four outer edge sections. Outer edge sections R13 (R13a) and R13 (R13b) are formed with a space along one outer edge of a light-emitting section R10, and outer edge sections R14 (R14a) and R14 (R14b) are formed with a space along the other one outer edge of the light-emitting section R10. The outer edge sections R13 (R13a) and R13 (R13b) are positioned at an opposite side to the outer edge sections R14 (R14a) and R14 (R14b) across the light-emitting section R10. Anode electrode taking-out sections 18 are formed on the outer edge sections R13 (R13a) and R14 (R14b) and cathode electrode taking-out sections 19 are formed on the outer edge sections R13 (R13b) and R14 (R14a).

The space between the outer edge sections R13 (R13a) and R13 (R13b) in the present modification is broader than that in the above-described sixth modification (see FIG. 14). The space between the outer edge sections R13 (R13a) and R14 (R14b) is broader than that in the sixth modification (see FIG. 14). Similar functions and effects to the above description can be obtained even when such a surface light-emitting element 10M is applied to the first and second embodiments.

(Twelfth Modification)

Figure 20:
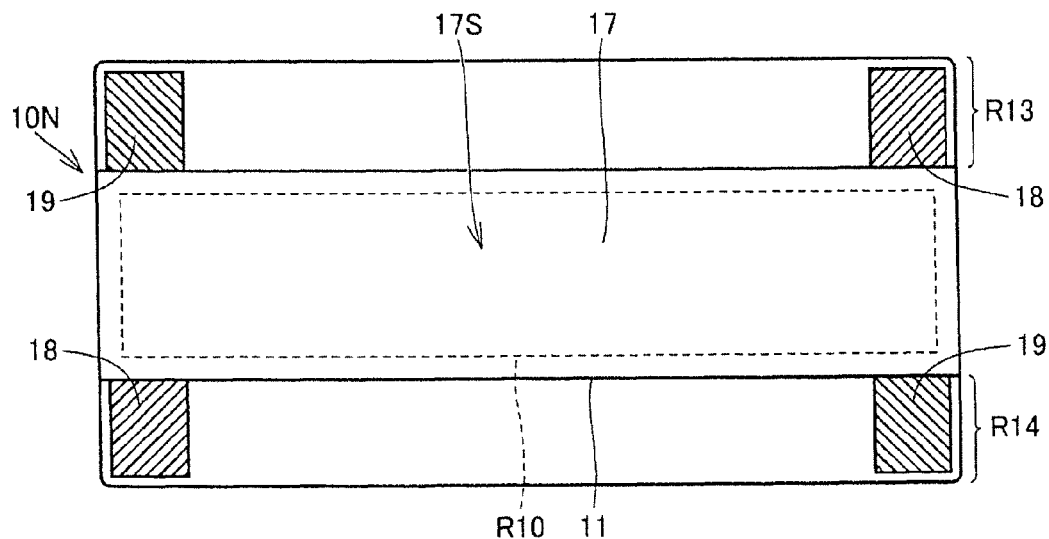
FIG. 20 is a plan view illustrating a surface light-emitting element in a twelfth modification of an embodiment.

Referring to FIG. 20, a surface light-emitting element 10N of the present modification includes two outer edge sections. An outer edge section R13 is formed along one outer edge of a light-emitting section R10, and an outer edge section R14 is formed with a space along the other one outer edge of the light-emitting section R10. The outer edge section R13 is positioned at an opposite side to the outer edge section R14 across the light-emitting section R10. An anode electrode taking-out section 18 and a cathode electrode taking-out section 19 are formed on the outer edge section R13, and another anode electrode taking-out section 18 and another cathode electrode taking-out section 19 are formed on the outer edge section R14. Similar functions and effects to the above description can be obtained even when such a surface light-emitting element 10N is applied to the first and second embodiments.

(Thirteenth Modification)

Figure 21:
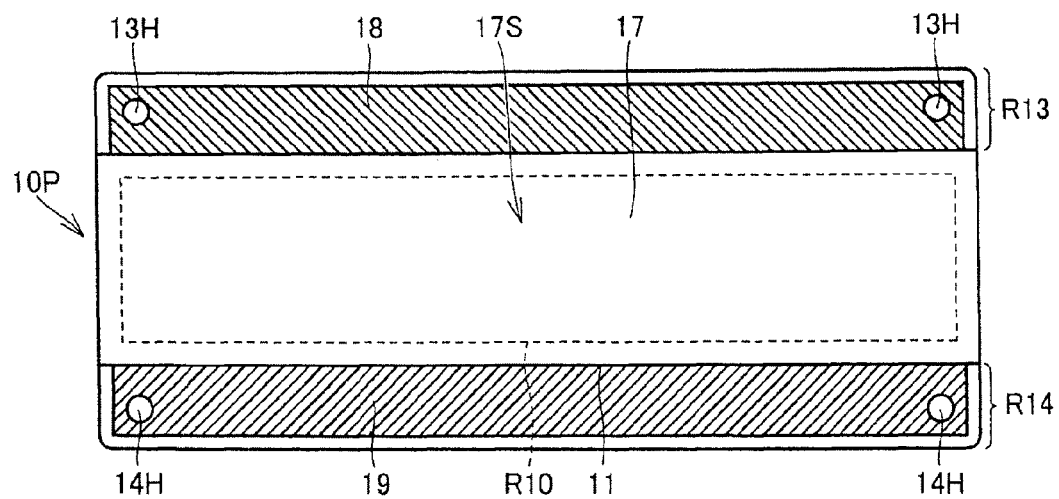
FIG. 21 is a plan view illustrating a surface light-emitting element in a thirteenth modification of an embodiment.

Referring to FIG. 21, a surface light-emitting element 10P of the present modification includes through holes 13H and 14H (first fixing sections) in addition to the configuration of the surface light-emitting element of the above-described first modification (see FIG. 9). The through holes 13H and 14H are provided to penetrate portions of the outer edge sections, where electrode taking-out sections 18 and 19 are provided. The outer edge sections are fixed to a housing 20 (see FIG. 1) through the through holes 13H and 14H. Similar functions and effects to the above description can be obtained even when such a surface light-emitting element 10P is applied to the first and second embodiments.

(Fourteenth Modification)

Figure 22:
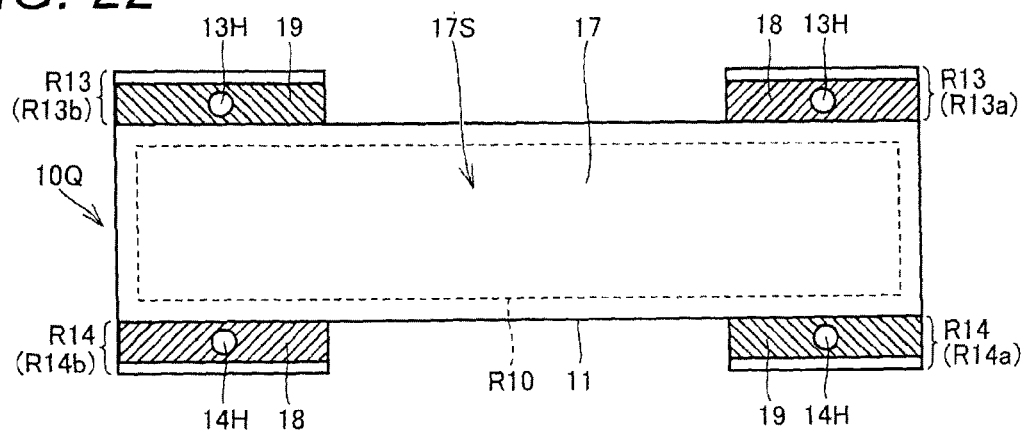
FIG. 22 is a plan view illustrating a surface light-emitting element in a fourteenth modification of an embodiment.

Referring to FIG. 22, a surface light-emitting element 10Q of the present modification includes through holes 13H and 14H (first fixing sections), in addition to the configuration of the surface light-emitting element of the above-described sixth modification (see FIG. 14). The through holes 13H and 14H are provided to penetrate portions of the outer edge sections, where electrode taking-out sections 18 and 19 are provided. The outer edge sections are fixed to a housing 20 (see FIG. 1) through the through holes 13H and 14H. Similar functions and effects to the above description can be obtained even when such a surface light-emitting element 10Q is applied to the first and second embodiments.

(Fifteenth Modification)

Figure 23:
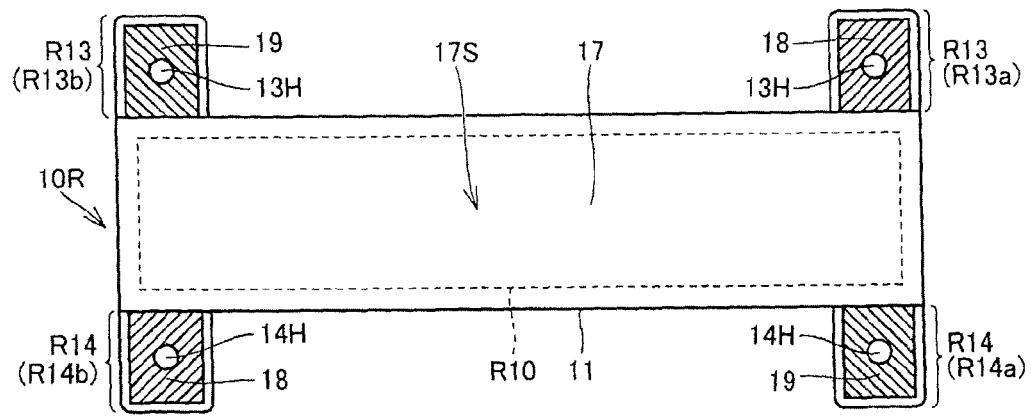
FIG. 23 is a plan view illustrating a surface light-emitting element in a fifteenth modification of an embodiment.

Referring to FIG. 23, a surface light-emitting element 10R of the present modification includes through holes 13H and 14H (first fixing sections), in addition to the configuration of the surface light-emitting element of the above-described eleventh modification (see FIG. 19). The through holes 13H and 14H are provided to penetrate portions of the outer edge sections, where electrode taking-out sections 18 and 19 are provided. The outer edge sections are fixed to a housing 20 (see FIG. 1) through the through holes 13H and 14H. Similar functions and effects to the above description can be obtained even when such a surface light-emitting element 10R is applied to the first and second embodiments.

(Sixteenth Modification)

Figure 24:
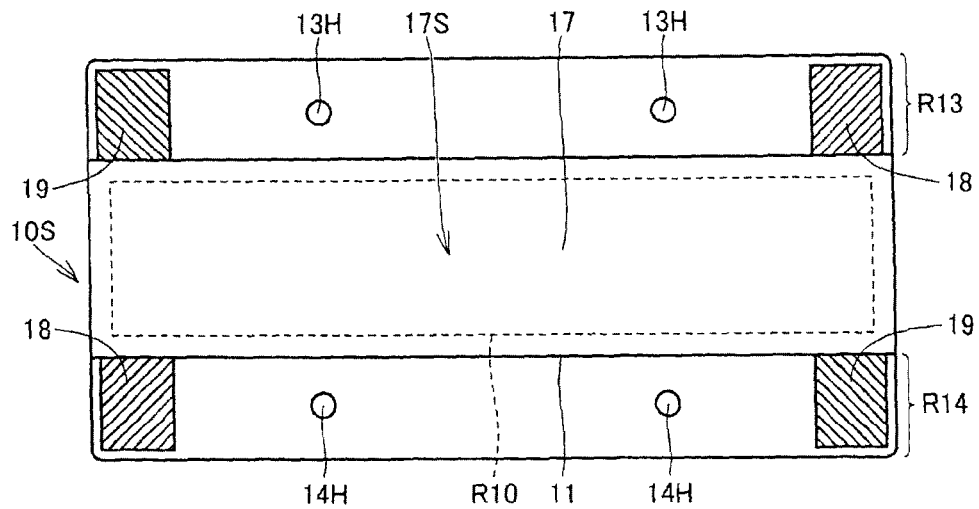
FIG. 24 is a plan view illustrating a surface light-emitting element in a sixteenth modification of an embodiment.

Referring to FIG. 24, a surface light-emitting element 10S of the present modification includes through holes 13H and 14H (second fixing sections), in addition to the configuration of the surface light-emitting element of the above-described twelfth modification (see FIG. 20). The through holes 13H and 14H are provided to penetrate portions of the outer edge sections, where electrode taking-out sections 18 and 19 are provided. The outer edge sections are fixed to a housing 20 (see FIG. 1) through the through holes 13H and 14H. Similar functions and effects to the above description can be obtained even when such a surface light-emitting element 10R is applied to the first and second embodiments.

The above-described light-emitting device includes a housing including a light-transmitting section, a surface light-emitting element arranged in the housing, and including a rectangular light-emitting section facing the light-transmitting section and a non-light-emitting section formed outside the light-emitting section, and an electronic device arranged in the housing. The non-light-emitting section includes a flexible outer edge section provided with an electrode on a surface. The outer edge section is bent in a direction away from a light-emitting surface of the light-emitting section together with the electrode. The electrode electrically connects the light-emitting section and the electronic device.

Preferably, the light-emitting section has flexibility and is bent along a shape of an inner peripheral surface of the light-transmitting section.

Preferably, the electrode includes an anode electrode and a cathode electrode, and the outer edge section includes a first outer edge section provided with the anode electrode and a second outer edge portion provided with the cathode electrode.

Preferably, another cathode electrode is further provided on the first outer edge section, and another anode electrode is further provided on the second outer edge section.

Preferably, the first outer edge section and the second outer edge section are positioned at mutually opposite sides across the light-emitting section.

Preferably, the outer edge section includes at least one first fixing section in a portion of the surface of the outer edge section, where the electrode is not provided, and the outer edge section is fixed to the housing through the first fixing section.

Preferably, the outer edge section includes at least one second fixing section in a portion of the surface of the outer edge section, where the electrode is provided, and the outer edge section is fixed to the electronic device through the second fixing section, so that the electrode is electrically connected to the electronic device.

Further, the above-described surface light-emitting element includes a rectangular light-emitting section and a non-light-emitting section formed outside the light-emitting section. The non-light-emitting section includes a flexible outer edge section. An electrode that electrically connects the light-emitting section and an electronic device is provided on a surface of the outer edge section in a state of being bent in the direction away from a light-emitting surface of the light-emitting section together with the outer edge section.

Preferably, the electrode includes an anode electrode and a cathode electrode, and the outer edge section includes a first outer edge section provided with the anode electrode and a second outer edge section provided with the cathode electrode.

Preferably, another cathode electrode is further provided on the first outer edge section, and another anode electrode is further provided on the second outer edge section.

Preferably, the first outer edge section and the second outer edge section are positioned at mutually opposite sides across the light-emitting section.

By employment of the above configuration, a surface light-emitting element that can be easily arranged in a narrow space, and a light-emitting device including such a surface light-emitting element can be obtained.

The embodiments and the modifications based on the present invention have been described. However, the embodiments and the modifications disclosed this time are mere examples in all aspects, and are not restrictive. It is planned to implement the embodiments and the modifications in combination with each other. The technical scope of the present invention is indicated by claims, and it is intended to include all changes within the meaning and the scope of claims and its equivalent.

REFERENCE SIGNS LIST 10, 10A, 10B, 10C, 10D, 10E, 10F, 10G, 10H, 10J, 10K, 10L, 10M, 10N, 10P, 10Q, 10R, 10S surface light-emitting element
11 Transparent substrate
11S Surface
12 Anode
13 Hole transport layer
13H and 14H Through hole (fixing section)
14 Organic layer
15 Electron transport layer
16 Cathode
17 Sealing member
17S Back surface
18 Electrode taking-out section (anode electrode)
19 Electrode taking-out section (cathode electrode)
20 Housing
21 Cover
22 Accommodation section
23 Bottom panel
23T Screw hole
24 Peripheral wall
25, 25a, 25b, and 25c Light-transmitting section
30 Display unit
31 Electronic substrate (electronic device)
32 Built-in device
40 Fixing tool
100, 101 Light-emitting device
R10, R10a, R10b, and R10c Light-emitting section
R11 and R12 Non-light-emitting section
R13 and R14 Outer edge section
S1, S1a, S1b, and S1c Light-emitting surface
S2 and S3 Non-light-emitting surface

The invention claimed is:

1. A light-emitting device comprising:
   a housing including a light-transmitting section;
   a surface light-emitting element arranged in the housing, and including a rectangular light-emitting section facing the light-transmitting section, and a non-light-emitting section formed outside the light-emitting section; and
   an electronic device arranged in the housing, wherein
   the non-light-emitting section includes a flexible outer edge section provided with an electrode on a surface,
   the outer edge section is bent in a direction away from a light-emitting surface of the light-emitting section together with the electrode, and
   the electrode electrically connects the light-emitting section and the electronic device,
   wherein the electrode includes at least either one of an anode electrode and a cathode electrode.

2. The light-emitting device according to claim 1, wherein the light-emitting section has flexibility, and is bent along a shape of an inner peripheral surface of the light-transmitting section.

3. The light-emitting device according to claim 1, wherein the outer edge section includes a first outer edge section provided with the anode electrode, and a second outer edge section provided with the cathode electrode.

4. The light-emitting device according to claim 3, wherein another cathode electrode is further provided on the first outer edge section, and
   another anode electrode is further provided on the second outer edge section.

5. The light-emitting device according to claim 3, wherein the first outer edge section and the second outer edge section are positioned at mutually opposite sides across the light-emitting section.

6. The light-emitting device according to claim 1, wherein the outer edge section includes at least one first fixing section in a portion where the electrode is not provided, the portion being of the surface of the outer edge section, and
   the outer edge section is fixed to the housing through the first fixing section.

7. The light-emitting device according to claim 1, wherein the outer edge section includes at least one second fixing section in a portion where the electrode is provided, the portion being of the surface of the outer edge section, and
   the electrode is electrically connected to the electronic device, by the outer edge section being fixed to the electronic device through the second fixing section.

8. The light-emitting device according to claim 1, wherein the outer edge section is formed integrated with the surface light-emitting element.

9. The light-emitting device according to claim 1, wherein the surface light-emitting element includes a transparent substrate, and the outer edge section is a part of the transparent substrate.

10. A surface light-emitting element comprising:
    a rectangular light-emitting section; and
    a non-light-emitting section formed outside the light-emitting section, wherein
    the non-light-emitting section includes a flexible outer edge section, and
    an electrode that electrically connects the light-emitting section and an electronic device is provided on a surface of the outer edge section in a state of being bent in a direction away from a light-emitting surface of the light-emitting section together with the outer edge section,
    wherein
    the electrode includes at least either one of an anode electrode and a cathode electrode.

11. The surface light-emitting element according to claim 10, wherein
    the outer edge section includes a first outer edge section provided with the anode electrode, and a second outer edge section provided with the cathode electrode.

12. The surface light-emitting element according to claim 11, wherein
    another cathode electrode is further provided on the first outer edge section, and
    another anode electrode is further provided on the second outer edge section.

13. The surface light-emitting element according to claim 11, wherein the first outer edge section and the second outer edge section are positioned at mutually opposite sides across the light-emitting section.

14. The surface light-emitting element according to claim 10, wherein
    the surface light-emitting element includes a transparent substrate, and the outer edge section is a part of the transparent substrate.

* * * * *